(12) United States Patent
Hatano et al.

(10) Patent No.: US 8,973,494 B2
(45) Date of Patent: Mar. 10, 2015

(54) IMPRINT METHOD AND IMPRINT APPARATUS

(75) Inventors: Masayuki Hatano, Kanagawa-ken (JP); Ikuo Yoneda, Kanagawa-ken (JP); Tetsuro Nakasugi, Kanagawa-ken (JP); Kenji Ooki, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 934 days.

(21) Appl. No.: 13/023,225

(22) Filed: Feb. 8, 2011

(65) Prior Publication Data

US 2011/0192300 A1    Aug. 11, 2011

(30) Foreign Application Priority Data

Feb. 8, 2010    (JP) .................................. 2010-25239

(51) Int. Cl.
*G03F 7/00* (2006.01)
*B82Y 10/00* (2011.01)

(52) U.S. Cl.
CPC .............. *G03F 7/0002* (2013.01); *B82Y 10/00* (2013.01)
USPC .............................................. 101/3.1; 101/32

(58) Field of Classification Search
CPC ................................................... G03F 7/0002
See application file for complete search history.

(56) References Cited

U.S. PATENT DOCUMENTS

| | | | | |
|---|---|---|---|---|
| 7,954,166 B2* | 5/2011 | Mirkin et al. | .................... | 850/40 |
| 2005/0118338 A1* | 6/2005 | Stebe et al. | .................... | 427/331 |

FOREIGN PATENT DOCUMENTS

| | | |
|---|---|---|
| JP | 2005-353858 | 12/2005 |
| JP | 2006-516065 | 6/2006 |
| JP | 2009-184361 | 8/2009 |
| JP | 2010-123757 | 6/2010 |

* cited by examiner

*Primary Examiner* — Joshua D Zimmerman
(74) *Attorney, Agent, or Firm* — Finnegan, Henderson, Farabow, Garrett & Dunner, L.L.P.

(57) ABSTRACT

According to one embodiment, an imprint method is disclosed. The method can include forming a liquid droplet of a transfer material with a volume greater than a predetermined reference volume by dropping the transfer material onto a major surface of a processing substrate. The method can include reducing the volume of the liquid droplet to be less than the reference volume by volatilizing the liquid droplet. In addition, the method can include filling the transfer material into a recess provided in a transfer surface of a template by bringing the liquid droplet having the volume reduced to be less than the reference volume into contact with the transfer surface of the template.

20 Claims, 7 Drawing Sheets

IMPRINT METHOD AND IMPRINT APPARATUS

CROSS-REFERENCE TO RELATED APPLICATIONS

This application is based upon and claims the benefit of priority from the prior Japanese Patent Application No. 2010-025239, filed on Feb. 8, 2010; the entire contents of which are incorporated herein by reference.

FIELD

Embodiments described herein relate generally to an imprint method and an imprint apparatus.

BACKGROUND

Imprint methods that transfer a master form onto a substrate are drawing attention as technology to form ultra-fine patterns with high productivity in the manufacture of electronic devices or magnetic recording media having ultra-fine structures such as semiconductor devices, MEMS (Micro Electro Mechanical System) devices, magnetic recording devices, etc.

In an imprint method, a template having a pattern to be transferred is brought into contact with a transfer material on a substrate; the transfer material is filled into a recess of the template; and the transfer material is cured to transfer the pattern of the template onto the transfer material on the substrate.

Conventional imprint methods require a long period of time to fill the transfer material into the recess of the template without defects, which impedes improvements to the productivity.

While JP-A 2006-516065 (Kohyo) discusses a method of viewing an alignment mark using a viewing device in an imprint method, the fill time of the transfer material cannot be reduced.

DETAILED DESCRIPTION

Figure 1:
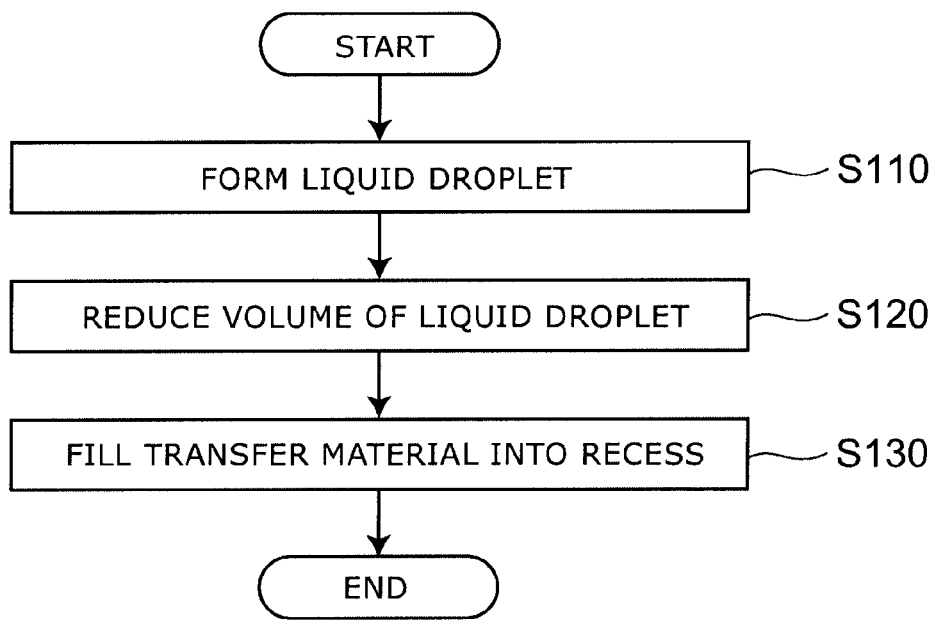
FIG. 1 is a flowchart illustrating an imprint method according to a first embodiment.

In general, according to one embodiment, an imprint method is disclosed. The method can include forming a liquid droplet of a transfer material with a volume greater than a predetermined reference volume by dropping the transfer material onto a major surface of a processing substrate. The method can include reducing the volume of the liquid droplet to be less than the reference volume by volatilizing the liquid droplet. In addition, the method can include filling the transfer material into a recess provided in a transfer surface of a template by bringing the liquid droplet having the volume reduced to be less than the reference volume into contact with the transfer surface of the template.

Embodiments will now be described with reference to the drawings.

The drawings are schematic or conceptual; and the relationships between the thicknesses and widths of portions, the proportional coefficients of sizes among portions, etc., are not necessarily the same as the actual values thereof. Further, the dimensions and the proportional coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a flowchart illustrating an imprint method according to a first embodiment.

Figure 2:
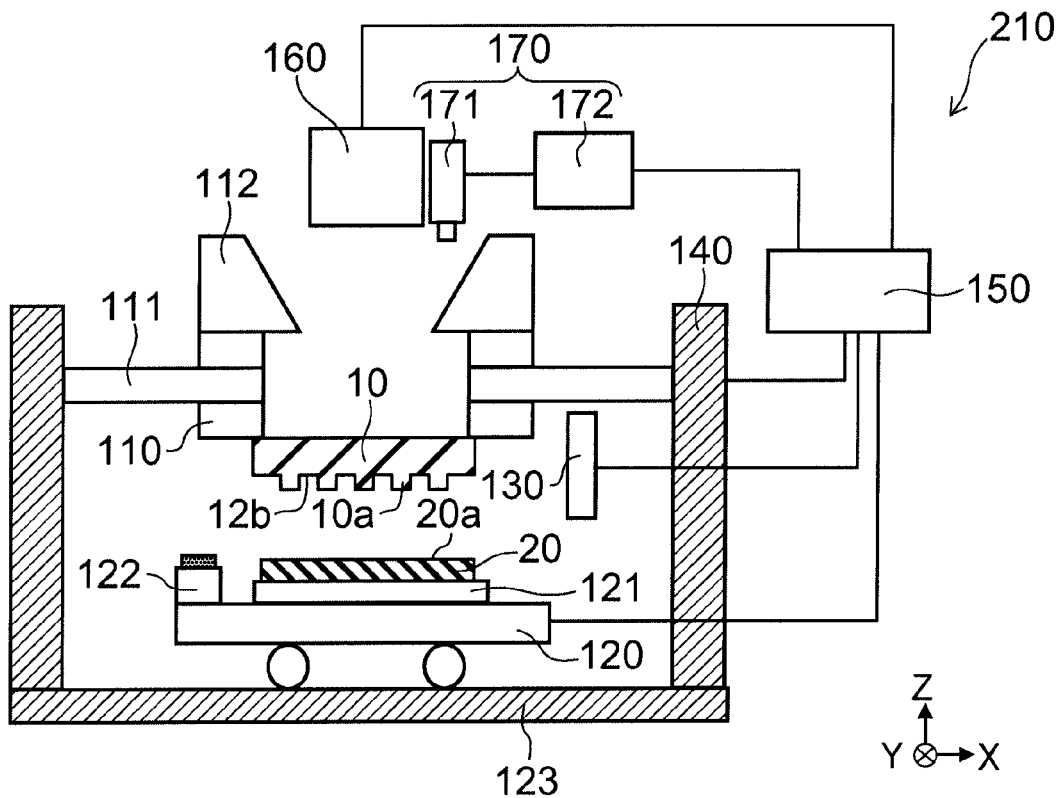
FIG. 2 is a schematic side view illustrating the configuration of an imprint apparatus usable in the imprint method according to the first embodiment.

FIG. 2 is a schematic side view illustrating the configuration of an imprint apparatus usable in the imprint method according to the first embodiment.

FIGS. 3A to 3E are schematic cross-sectional views in order of the processes, illustrating the imprint method according to the first embodiment.

First, an example of the imprint apparatus usable in the imprint method according to this embodiment will be described using FIG. 2.

As illustrated in FIG. 2, the imprint apparatus 210 includes: a substrate stage 120 configured to have a processing substrate 20 placed thereon; a template holder 110 configured to hold a template 10; a dropping unit 130 configured to form a liquid droplet of a transfer material by dropping the transfer material onto a major surface 20a of the processing substrate 20 placed on the substrate stage 120; a distance control unit 140 configured to fill the transfer material into a recess 12b of the template 10 by bringing the liquid droplet into contact with a transfer surface 10a of the template 10 by changing the distance from the major surface 20a of the processing substrate 20 to the transfer surface 10a of the template 10; and a control unit 150 configured to control the distance control unit 140.

In this specific example, the imprint apparatus 210 further includes a measurement unit 170 configured to measure the diameter of the liquid droplet formed on the major surface 20a of the processing substrate 20. Also, the imprint apparatus 210 of this specific example further includes a light irradiation unit 160 configured to cure the transfer material by irradiating light onto the transfer material filled into the recess 12b of the template 10. The measurement unit 170 and the light irradiation unit 160 may be provided as necessary or may be omitted. For example, the measurement unit 170 and the light irradiation unit 160 may be provided as separate entities from the imprint apparatus 210.

The processing substrate 20 may include, for example, any substrate such as a semiconductor substrate (a wafer), an insulating substrate having a semiconductor layer or a conductive layer provided thereon, a substrate having a hard mask layer provided thereon, etc. The template 10 may include, for example, quartz and the like. The transfer material may include, for example, a photocurable resin and the like.

Herein, the direction from the surface of the substrate stage 120 configured to have the processing substrate 20 placed thereon toward the template 10 held by the template holder 110 is taken as a Z-axis direction. The upward direction is the positive direction of the Z axis; and the downward direction is the negative direction. One direction perpendicular to the Z-axis direction is taken as the X-axis direction. A direction perpendicular to the Z-axis direction and the X-axis direction is taken as the Y-axis direction.

The substrate stage 120 is provided on a stage planar table 123 and can move, for example, along the X-axis direction. A substrate vacuum-attachment unit 121 is provided on the substrate stage 120; the processing substrate 20 is placed on the substrate vacuum-attachment unit 121; and the processing substrate 20 is fixed on the substrate stage 120 by the substrate vacuum-attachment unit 121. A reference mark table 122 for controlling the position of the substrate stage 120 is provided on the substrate stage 120.

For example, the substrate stage 120 is moved along the X-axis direction; the processing substrate 20 is disposed below the dropping unit 130; and the transfer material is dropped onto the major surface 20a of the processing substrate 20. The dropping unit 130 may include, for example, a liquid droplet dropping apparatus using an inkjet method and the like that uses a piezoelectric element, etc.

The substrate stage 120 returns to the initial position along the X-axis direction; and in this state, the major surface 20a of the processing substrate 20 opposes the transfer surface 10a of the template 10 held by the template holder 110.

The template holder 110 is linked to a base 111; and the base 111 is linked to the distance control unit 140. The distance control unit 140 moves, for example, the template holder 110 in the Z-axis direction to change the distance from the major surface 20a of the processing substrate 20 to the transfer surface 10a of the template 10 to bring the liquid droplet and the transfer surface 10a into contact. It is sufficient to be able to change the relative positions of the major surface 20a of the processing substrate 20 and the transfer surface 10a of the template 10; and the distance control unit 140 may move at least one selected from the template holder 110 and the substrate stage 120 along the Z-axis direction.

An alignment sensor 112 is additionally provided to the base 111 to appropriately control the positions in the X-Y plane of the substrate stage 120 and the template holder 110 and, as a result, to appropriately control the positions in the X-Y plane of the processing substrate 20 and the template 10.

The transfer material is cured by irradiating light onto the transfer material via the template 10 by emitting light from the light irradiation unit 160 in a state in which the transfer material on the processing substrate 20 is filled into the recess 12b of the template 10 and the transfer material deforms to conform to an unevenness pattern of the template 10. Subsequently, the transfer material is separated from the template 10. Thereby, the configuration of the unevenness of the template 10 is transferred onto the transfer material.

The measurement unit 170 may include an imaging unit 171 configured to image the liquid droplet provided on the processing substrate 20 and an image processing unit 172 configured to process the image which is imaged by the imaging unit 171. Although the measurement unit 170 has a function of measuring the diameter of the liquid droplet formed on the major surface 20a of the processing substrate 20, the measurement unit 170 also can be used to recognize a positional alignment mark for performing the positional alignment (the alignment) between the processing substrate 20 and the template 10. The imaging unit 171 may include, for example, a CCD camera and the like.

A specific example of the imprint method implemented using such an apparatus will now be described.

Figure 3A:
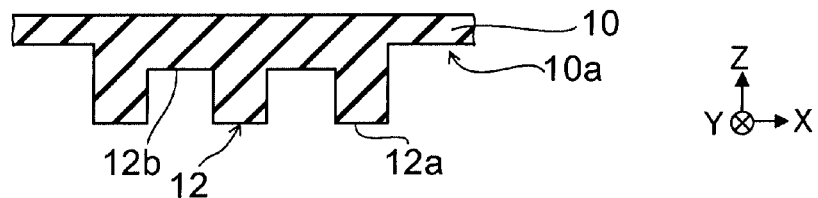
FIGS. 3A to 3E are schematic cross-sectional views in order of the processes, illustrating the imprint method according to the first embodiment.

As illustrated in FIG. 3A, an unevenness 12 is provided in the transfer surface 10a of the template 10. The unevenness 12 includes a recess 12b and a protrusion 12a. For example, in the case where the recess 12b is provided in the transfer surface 10a, the portions other than the recess 12b may be considered to be the protrusion 12a; and in the case where the protrusion 12a is provided in the transfer surface 10a, the portions other than the protrusion 12a may be considered to be the recess 12b. In other words, the recess 12b and the protrusion 12a are relative to each other. Thus, the recess 12b is provided in the transfer surface 10a of the template 10.

For example, the direction perpendicular to the transfer surface 10a of the template 10 corresponds to the Z-axis direction. The transfer surface 10a of the template 10 is disposed parallel to the X-Y plane by the template holder 110.

In the template 10, the recess 12b is a portion recessed from the transfer surface 10a along the Z-axis direction.

The unevenness 12 of the template 10 has a configuration to be transferred onto a transfer material 30. The configuration of the unevenness 12 (including the depth, etc.) is arbitrary. The planar configuration (the pattern configuration as viewed from the Z-axis direction) of the recess 12b (and the protrusion 12a) of the unevenness 12 is arbitrary and may have, for example, a trench configuration extending in one direction, a rectangular or square configuration, a circular or flattened circular configuration, or any polygonal shape.

Figure 3B:
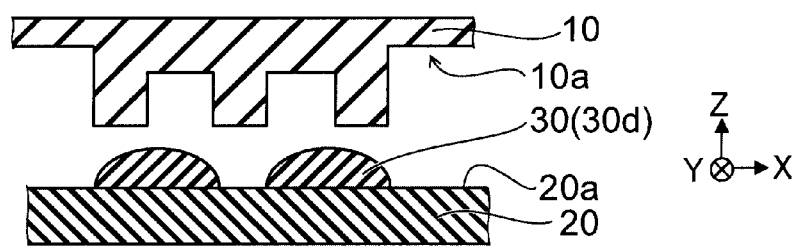

As illustrated in FIG. 3B, the template 10 is disposed such that the transfer surface 10a of the template 10 (the surface in which the recess 12b is provided) opposes the transfer material 30 provided on the major surface 20a of the processing substrate 20. In this state, the transfer material 30 is a liquid.

Figure 3C:
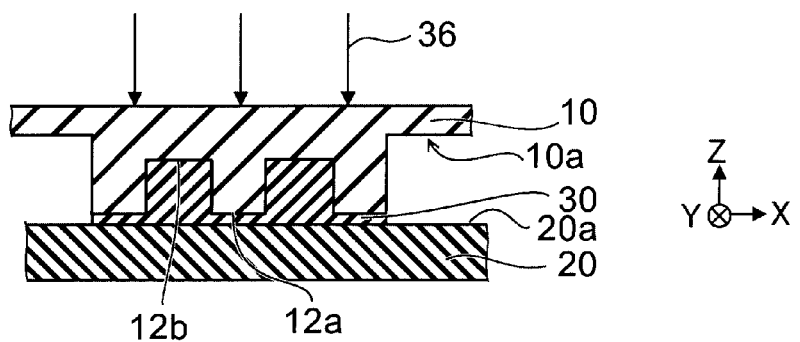

As illustrated in FIG. 3C, the distance between the processing substrate 20 and the template 10 is reduced to bring the transfer surface 10a of the template 10 and the transfer material 30 into contact with each other. Because the transfer material 30 is a liquid, the transfer material 30 enters into the recess 12b due to, for example, capillary action; and the recess 12b is filled with the transfer material 30. Thereby, the configuration of the transfer material 30 changes into a configuration conforming to the configuration of the recess 12b (and the protrusion 12a); and in this state, the pattern of the recess 12b (the pattern configuration of the unevenness 12 of the template 10) is transferred onto the transfer material 30 by curing the transfer material 30. For example, in the case where the transfer material 30 is a photocurable resin, light 36 that causes curing to progress is irradiated. Ultraviolet light having a wavelength of, for example, about 300 nm to 400 nm may be used as the light 36.

Thereby, the liquid transfer material 30 is cured to form a cured transfer layer 31; and the configuration of the recess 12b of the template 10 is transferred onto the surface of the cured transfer layer 31.

Figure 3D:
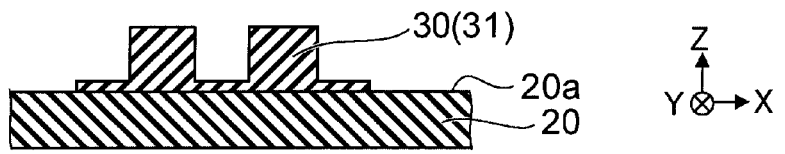

Then, as illustrated in FIG. 3D, the distance between the processing substrate 20 and the template 10 is increased to separate the cured transfer layer 31 and the template 10 from each other. Thereby, the configuration of the unevenness 12 of the template 10 is transferred onto the transfer material 30 (the cured transfer layer 31).

In the process illustrated in FIG. 3C, the protrusion 12a of the template 10 may not completely contact the processing substrate 20; the transfer material 30 may exist between the template 10 and the processing substrate 20; the cured transfer layer 31 may be formed also at the portion between the template 10 and the processing substrate 20; and a residual film may be formed.

Figure 3E:
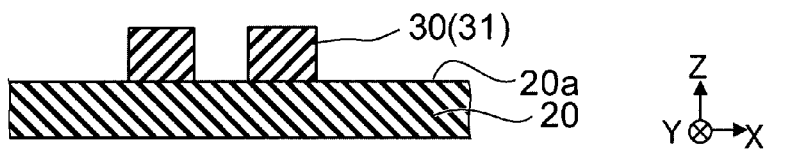

In such a case, as illustrated in FIG. 3E, etch-back may be performed on the entire cured transfer layer 31 by, for example, anisotropic RIE (Reactive Ion Etching) and the like to remove the residual film recited above.

Thus, the imprint process of transferring the pattern of the recess 12b onto the transfer material 30 is completed.

The inventors performed an experiment using an imprint method such as those recited above regarding the relationship between the size of the liquid droplet (the volume of the liquid droplet) of the transfer material 30 formed on the major surface 20a of the processing substrate 20 and the time until the transfer material 30 finishes filling into the recess 12b of the template 10. The experiment will now be described.

In this experiment, the volume of the liquid droplet of the dropped transfer material 30 was changed by controlling the nozzle of the dropping unit 130 (e.g., an inkjet device); and the time until the transfer material 30 finished filling into the recess 12b of the template 10 was measured. Although bubbles existed in the recess 12b and the transfer material 30 was not completely filled into the recess 12b when the transfer material 30 contacted the transfer surface 10a of the template 10, the bubbles disappeared and the recess 12b was completely filled with the transfer material 30 as time elapsed. The time from when the transfer material 30 and the transfer surface 10a of the template 10 were brought into contact until the bubbles disappeared and the recess 12b was completely filled with the transfer material 30 is a fill time Ts.

FIGS. 4A to 4D are schematic views illustrating a characteristic of the imprint method according to the first embodiment.

Figure 4A:
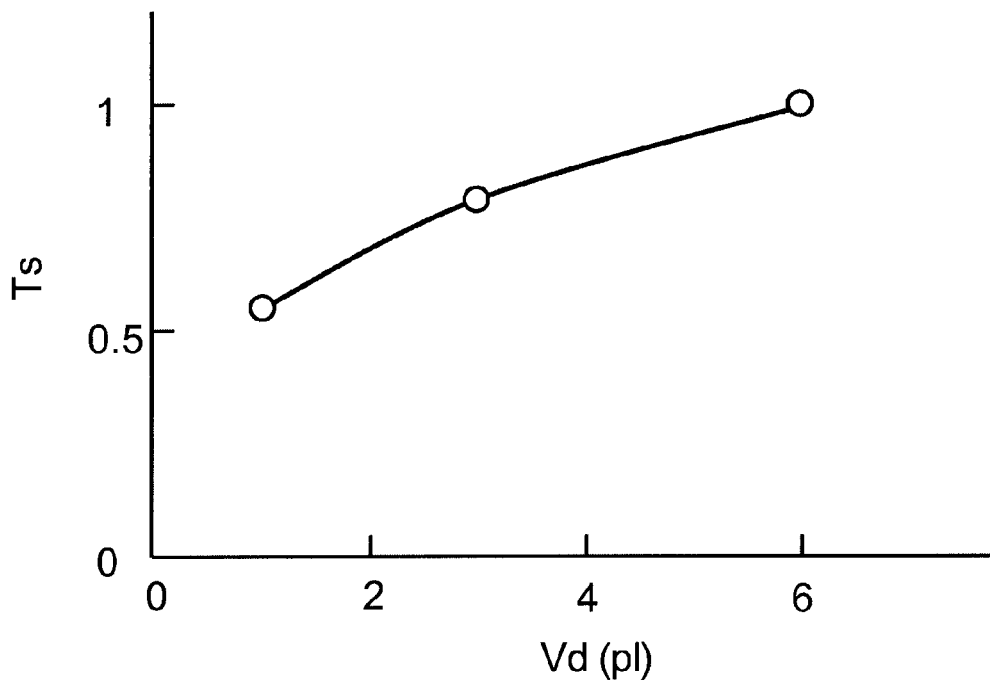
FIGS. 4A to 4D are schematic views illustrating a characteristic of the imprint method according to the first embodiment.

Namely, FIG. 4A is a graph illustrating the result of this experiment; the horizontal axis is the volume of one liquid droplet (a liquid droplet volume Vd) of the transfer material 30; and the vertical axis is the fill time Ts. The fill time Ts is illustrated as a ratio to the fill time when the liquid droplet volume Vd is 6 pl (picoliters). In this experiment, the three types of 1 pl, 3 pl, and 6 pl were used as the liquid droplet volume Vd of the transfer material 30.

Figure 4B:
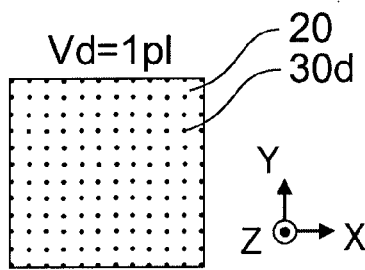
Figure 4C:
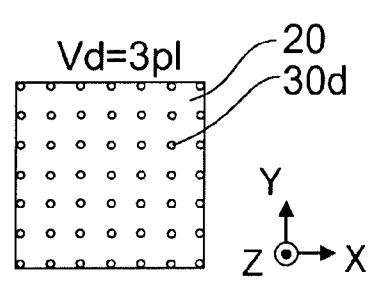
Figure 4D:
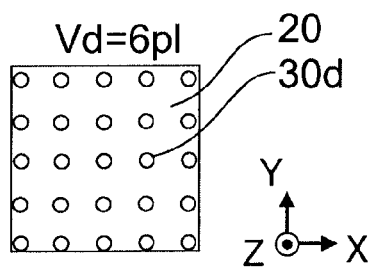

FIG. 4B, FIG. 4C, and FIG. 4D are schematic plan views illustrating the disposition state of the liquid droplets when the liquid droplet volume Vd was 1 pl, 3 pl, and 6 pl, respectively. In other words, these drawings are schematic views of the processing substrate 20 and liquid droplets 30d as viewed from the Z-axis direction.

As illustrated in FIG. 4B, FIG. 4C, and FIG. 4D, the disposition density of the liquid droplets was changed to match the change of the liquid droplet volume Vd such that the amount (the volume) of the transfer material 30 per unit surface area of the major surface 20a of the processing substrate 20 was constant. In other words, the disposition density of the liquid droplets was set to be high in the case where the liquid droplet volume Vd was small and the disposition density of the liquid droplets was set to be low in the case where the liquid droplet volume Vd was large.

As illustrated in FIG. 4A, it was shown that the fill time Ts decreases as the liquid droplet volume Vd decreases. In other words, even for the same volume per unit surface area of the transfer material 30 provided on the major surface 20a of the processing substrate 20, reducing the volume of each of the liquid droplets 30d and increasing the disposition density of the liquid droplets 30d can provide a fill time Ts shorter than the case where the volume of each of the liquid droplets 30d is large and the disposition density of the liquid droplets 30d is low.

This embodiment was carried out based on the phenomenon newly discovered in experiments.

In the case where the volume (the size) of each of the liquid droplets 30d is reduced, the fluctuation of the volume (the size) of the liquid droplets 30d increases. In other words, in the case where the liquid droplet 30d is small for, for example, the inkjet device and the like used as the dropping unit 130, problems occur such as easier clogging of the openings of the inkjet head where the transfer material 30 is dispensed, etc. Therefore, it is desirable for the size of the liquid droplets 30d dropped from the dropping unit 130 to be large to increase the controllability of the volume (the size) of the liquid droplets 30d.

On the other hand, by volatilizing the liquid droplet 30d dropped onto the major surface 20a of the processing substrate 20, the volume of the liquid droplet 30d can be reduced. The imprint method of this embodiment is an application of this phenomenon. In other words, the volume of the liquid droplet 30d dropped from the dropping unit 130 is set to be large; the liquid droplet 30d dropped onto the major surface 20a of the processing substrate 20 is subsequently volatilized; the volume of the liquid droplet 30d is reduced; and the liquid droplet 30d having the reduced volume is brought into contact with the transfer surface 10a of the template 10. Thereby, the fill time Ts can be shorter.

In other words, as illustrated in FIG. 1, the imprint method according to this embodiment includes: forming the liquid droplet 30d of the transfer material 30 with a volume greater than a predetermined reference volume by dropping the transfer material 30 onto the major surface 20a of the processing substrate 20 (step S110); reducing the volume of the liquid droplet 30d to be less than the reference volume by volatilizing the liquid droplet 30d (step S120); and filling the transfer material 30 into the recess 12b by bringing the liquid droplet 30d having the volume reduced to be less than the reference volume into contact with the transfer surface 10a of the template 10 including the recess 12b provided in the transfer surface 10a (step S130).

For example, for the characteristic illustrated in FIGS. 4A to 4D, the reference volume recited above may be set to be 4 pl. Then, in step S110, the volume (the liquid droplet volume Vd) of the liquid droplet 30d of the transfer material 30 may be set to be, for example, 6 pl. In the case where the volume (the liquid droplet volume Vd) of the liquid droplet 30d of the transfer material 30 is large such as 6 pl, stable dropping is possible; and the uniformity of the liquid droplet volume Vd of the liquid droplet 30d is high. In other words, the reference volume is determined based on the volume of the liquid droplet 30d when the volume of the liquid droplet 30d stabilizes in the forming of the liquid droplet 30d. In other words, the fluctuation of the volume of the liquid droplet 30d when the liquid droplet 30d is formed with a volume greater than the reference volume is less than the fluctuation of the volume of the liquid droplet 30d when the liquid droplet 30d is formed with a volume less than the reference volume.

In step S120, the liquid droplet 30d is volatilized; the volume of the liquid droplet 30d is reduced to be less than the reference volume; and the liquid droplet volume Vd of the liquid droplet 30d becomes, for example, 1 pl.

Then, in step S130, the liquid droplet volume Vd is reduced; and the transfer material 30 is filled into the recess 12b by bringing the liquid droplet 30d which has become 1 pl into contact with the transfer surface 10a of the template 10.

Thereby, as illustrated in FIG. 4A, the filling can be completed in about one-half of the fill time Ts compared to when the liquid droplet volume Vd is 6 pl. Thus, according to the imprint method according to this embodiment, an imprint method can be provided in which the fill time Ts of the transfer material 30 into the recess 12b of the template 10 is shorter and the productivity is higher.

Figure 5:
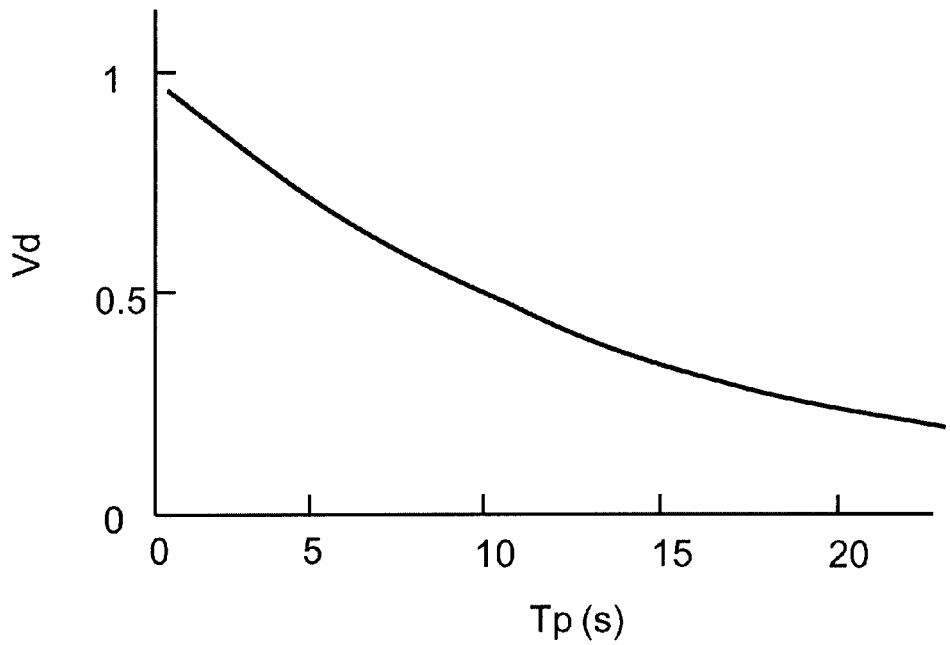
FIG. 5 is a graph illustrating a characteristic of the imprint method according to the first embodiment.

FIG. 5 is a graph illustrating a characteristic of the imprint method according to the first embodiment.

Namely, the horizontal axis of the drawing is an elapsed time Tp from when the transfer material 30 is dropped onto the major surface 20a of the processing substrate 20; and the vertical axis is the liquid droplet volume Vd of the liquid droplet 30d. The liquid droplet volume Vd is illustrated as a ratio to the value when the transfer material 30 is brought into contact with the transfer surface 10a of the template 10. The liquid droplet volume Vd was ascertained from the configuration of the liquid droplet 30d by measuring the diameter of the liquid droplet 30d.

As illustrated in FIG. 5, the liquid droplet volume Vd of the liquid droplet 30d dropped onto the major surface 20a of the processing substrate 20 decreases as time elapses. This is because the transfer material 30 of the liquid droplet 30d volatilizes as time elapses.

Thus, this embodiment is based on the phenomenon first discovered herein and described in regard to FIGS. 4A to 4D in which the fill time Ts is shorter in the case where the liquid droplet volume Vd is small and the phenomenon illustrated in FIG. 5 in which the volume of the liquid droplet 30d of the transfer material 30 decreases as the transfer material 30 volatilizes.

The fill time Ts is reduced by dropping the transfer material 30 with a volume (a first volume) that is greater than a predetermined reference volume (e.g., a first reference volume) and allows stable dropping when dropping the transfer material 30; subsequently reducing the volume of the liquid droplet 30d to a volume (a second volume) less than a predetermined reference volume (e.g., a second reference volume); and in this state, bringing the liquid droplet 30d of the transfer material 30 into contact with the transfer surface 10a of the template 10.

The reference volume (e.g., the first reference volume) used when dropping the transfer material 30 may be different from the reference volume (e.g., the second reference volume) used when bringing the liquid droplet 30d of the transfer material 30 into contact with the transfer surface 10a of the template 10. However, the second reference volume is not more than the first reference volume. In this specific example, the first reference volume may be set to be, for example, 5 pl; and the second reference volume may be set to be, for example, 3 pl.

Accordingly, in step S110, the liquid droplet 30d of the transfer material 30 can be formed with a volume greater than the predetermined first reference volume by dropping the transfer material 30 onto the major surface 20a of the processing substrate 20. Then, in step S120, the volume of the liquid droplet 30d can be reduced to be less than the second reference volume which is not more than the first reference volume by volatilizing the liquid droplet 30d. Then, in step S130, the transfer material 30 can be filled into the recess 12b by bringing the liquid droplet 30d having the volume reduced to be less than the second reference volume into contact with the transfer surface 10a of the template 10 including the recess 12b provided in the transfer surface 10a.

In a general imprint method, the transfer material 30 may be volatilized after being dropped onto the major surface 20a of the processing substrate 20 to reduce the volume of the liquid droplet 30d; and transferring may be performed in such a state. In such a case, even if a reference volume (e.g., the first reference volume) is provided when dropping the transfer material 30 (step S110) to drop the transfer material 30 with a constant amount, a reference volume (e.g., the second reference volume) is not provided in the transferring (step S130). In other words, a reference value regarding the change of the volume of the transfer material 30 after the transfer material 30 is dropped is not provided.

Conversely, the reference volume (e.g., the second reference volume) is determined as a reference value in step S130 of this embodiment. Thereby, step S130 can be implemented using the liquid droplet 30d in a state of having a volume less than the reference volume. Thereby, the fill time Ts can be shorter. In other words, by providing the reference volume in step S110, stable dropping can be realized; and by providing the reference volume also in step S130, the fill time Ts is shorter.

In this embodiment, the volume (or a value corresponding to the volume) of the liquid droplet 30d provided on the major surface 20a of the processing substrate 20 is measured; and step S130 can be implemented based on the measurement results. The wait time is controlled based on data relating to the change of the volume of the liquid droplet 30d after the transfer material 30 is dropped onto the major surface 20a of the processing substrate 20; and step S130 also can be implemented. First, the method of the latter will be described.

As described in regard to FIG. 5, the liquid droplet volume Vd of the liquid droplet 30d dropped onto the major surface 20a of the processing substrate 20 decreases as time elapses. Based on such data, a constant wait time is provided after dropping onto the major surface 20a of the processing substrate 20; and step S130 can be implemented subsequently.

In other words, the process of filling (step S130) can be implemented after the set wait time has elapsed from when the process of forming the liquid droplet 30d (step S110) is implemented, where the set wait time is preset based on data relating to the time dependency of the reduction of the volume of the liquid droplet 30d due to the volatilizing.

Figure 6:
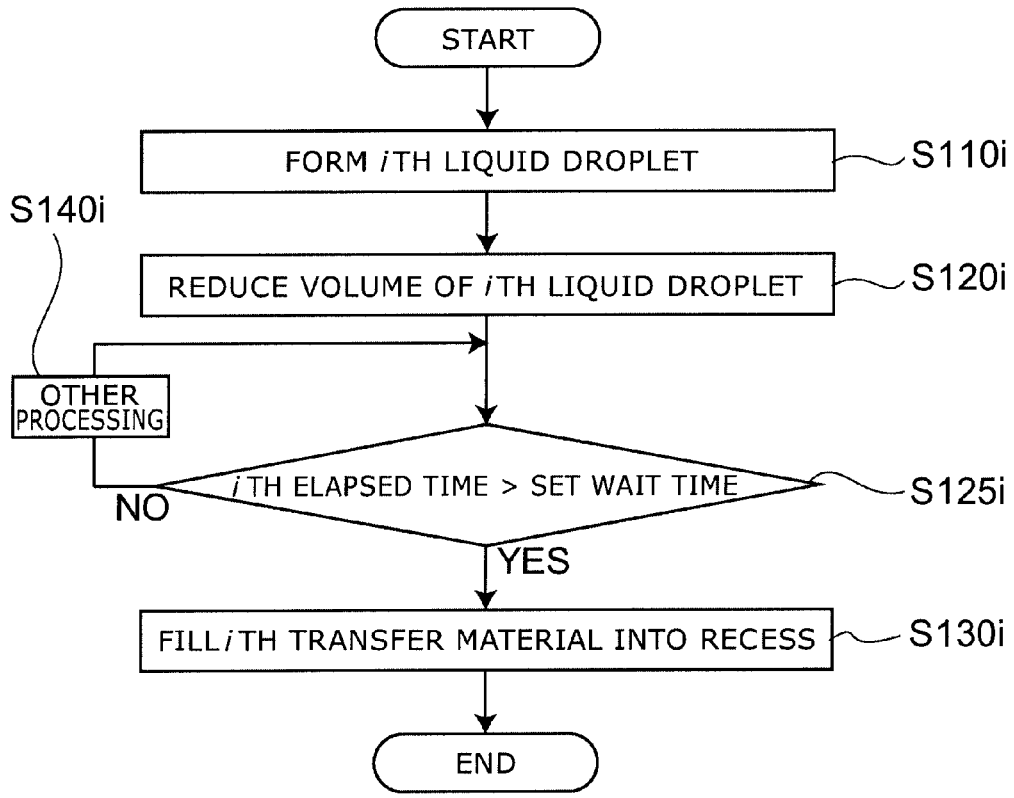
FIG. 6 is a flowchart illustrating another imprint method according to the first embodiment.

FIG. 6 is a flowchart illustrating another imprint method according to the first embodiment.

In this specific example, the major surface 20a of the processing substrate 20 has multiple regions; and imprint processing is implemented on each of the multiple regions.

As illustrated in FIG. 6, the liquid droplet 30d is formed in an ith region (i being an integer not less than 1) (step S110i). Then, the volume of the liquid droplet 30d is reduced in the ith region (step S120i). Continuing, the elapsed time from when step S110i was implemented is compared to a preset set wait time for the ith region (step S125i). Then, in the case where the elapsed time is not more than the set wait time, other processing is performed (step S140i). In the other processing, for example, the formation of the (i+j)th liquid droplet 30d may be performed (j being an integer not less than 1). Or, in the other processing, any processing may be performed.

Then, in the case where the elapsed time exceeds the preset set wait time, the ith filling is performed (step S130i).

By repeating these processes, the imprint processing can be implemented on the multiple regions of the major surface 20a of the processing substrate 20 efficiently in a short period of time.

Thus, the major surface 20a of the processing substrate 20 has multiple regions; and the liquid droplet 30d can be formed for the one other of the multiple regions (step S110) while the volume of the liquid droplet 30d is being reduced for the one of the multiple regions (step S120). Also, the transfer material 30 can be filled for the one other of the multiple regions (step S130) while the volume of the liquid droplet 30d is being reduced for the one of the multiple regions (step S120). Further, the volume of the liquid droplet 30d can be reduced for the one other of the multiple regions (step S120) while the volume of the liquid droplet 30d is being reduced for the one of the multiple regions (step S120).

First Example

An imprint method of a first example of the first embodiment will now be described. The method illustrated in FIG. 6 is performed in the imprint method of the first example.

Figure 7:
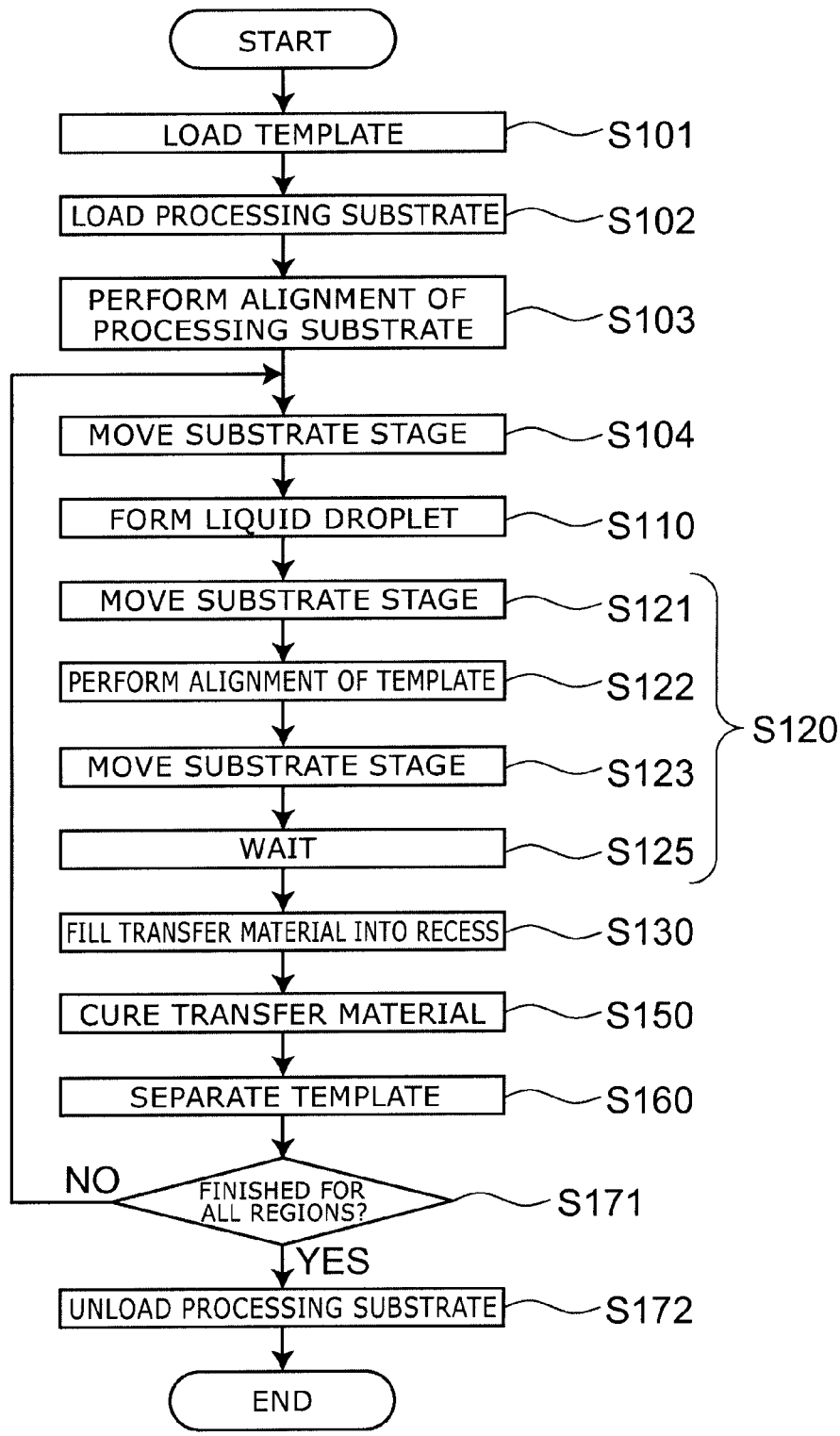
FIG. 7 is a flowchart illustrating an imprint method of a first example.

FIG. 7 is a flowchart illustrating the imprint method of the first example. As illustrated in FIG. 7, first, the template 10 is loaded and set on the template holder 110 (step S101).

Then, the processing substrate 20 (e.g., a wafer) is loaded and set on the substrate stage 120 (step S102).

Continuing, the alignment of the processing substrate 20 is performed (step S103).

Then, the substrate stage 120 is moved (step S104); and the processing substrate 20 is disposed below the dropping unit 130.

Continuing, the liquid droplet 30d is formed on the major surface 20a of the processing substrate 20 by dropping the transfer material 30 (step S110). At this time, as described above, the volume of the liquid droplet 30d is set to be greater than the predetermined reference volume (e.g., the first reference volume).

Then, the substrate stage 120 is moved (step S121); the alignment of the template 10 is implemented (step S122); and the substrate stage 120 is moved (step S123). At this time, the volume of the liquid droplet 30d is reduced to be less than the reference volume by volatilizing the liquid droplet 30d (step S120). Then, waiting is performed as necessary (step S125). The liquid droplet may be formed in other regions as the other processing (step S140i) performed as described in regard to FIG. 6 during the wait time. The waiting recited above (step S125) includes step S125 described in regard to FIG. 6 (the comparison between the elapsed time from when step S110i is implemented and the preset set wait time).

Then, the transfer material 30 is filled into the recess 12b of the template 10 by bringing the liquid droplet 30d having the reduced volume into contact with the transfer surface 10a of the template 10 (step S130). Then, the transfer material 30 is cured in this state (step S150).

Continuing, the template 10 is separated (step S160).

Then, it is determined whether or not processing recited above has been implemented for all of the regions of the processing substrate 20 (all shots have been completed) (step S171). If incomplete, the flow returns to step S104 and the processes recited above are repeated. If complete, the processing substrate 20 is unloaded (step S172) and the flow ends.

According to the imprint method of this specific example, the liquid droplet 30d having a stable volume can be formed because the liquid droplet 30d is formed with a volume greater than the reference volume in step S110; and the fill time Ts can be shorter because transferring is implemented with the liquid droplet 30d being less than the reference volume in step S130.

A method of measuring the volume (or a value corresponding to the volume) of the liquid droplet 30d provided on the major surface 20a of the processing substrate 20 and implementing step S130 based on the measurement results will now be described. In this specific example, the diameter of the liquid droplet 30d is measured as a value corresponding to the volume of the liquid droplet 30d.

Figure 8:
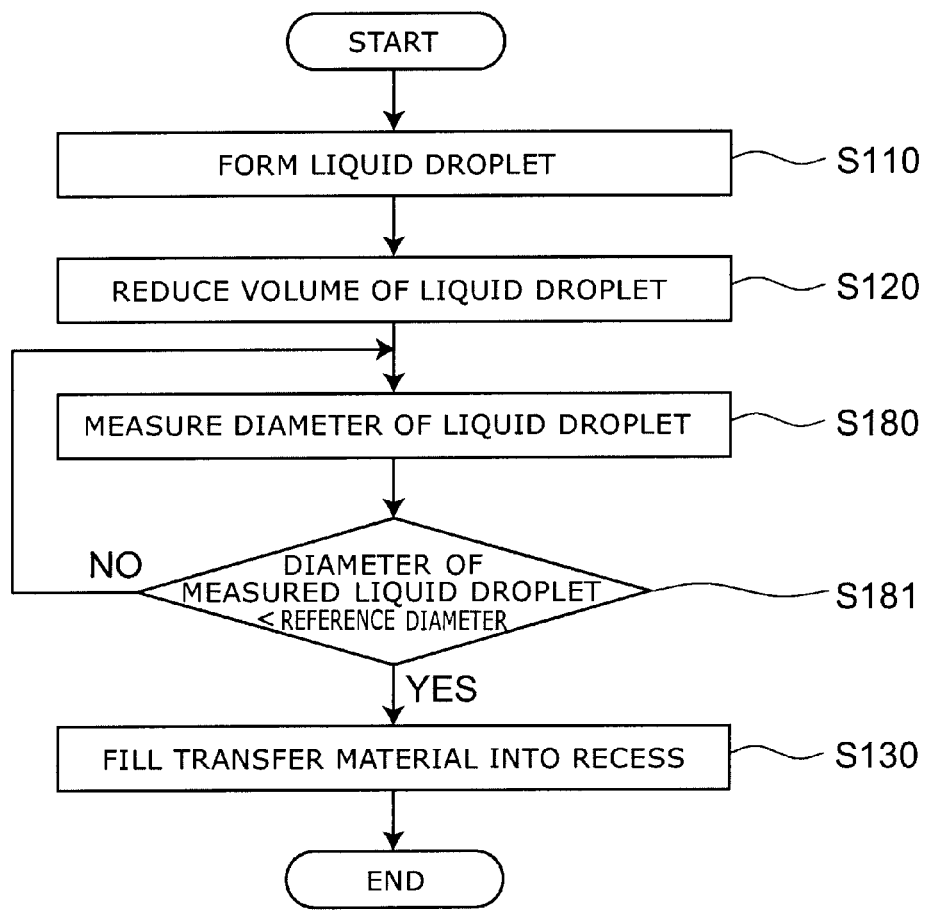
FIG. 8 is a flowchart illustrating one other imprint method according to the first embodiment.

FIG. 8 is a flowchart illustrating one other imprint method according to the first embodiment.

The imprint method of this specific example as illustrated in FIG. 8 further includes, in addition to the method described in regard to FIG. 1, a process of measuring the diameter of the liquid droplet 30d (step S180). The measurement of the liquid droplet 30d is performed, for example, by the measurement unit 170 described in regard to FIG. 2.

Then, the process of filling (step S130) is implemented in the case where the diameter of the liquid droplet 30d measured in the process of measuring (step S180) is smaller than the reference diameter determined based on the reference volume.

For example, step S130 is implemented in the case where the diameter of the measured liquid droplet 30d is compared to the reference diameter (step S181) and the diameter of the measured liquid droplet 30d is smaller than the reference diameter.

Then, in the case where the diameter of the measured liquid droplet 30d is not less than the reference diameter, the volume of the liquid droplet 30d is reduced, for example, by allowing a constant amount of time to elapse; the diameter of the liquid droplet 30d is reduced; the flow returns to step S180; and the diameter of the liquid droplet 30d is remeasured. The processes recited above may be repeated.

Thereby, the diameter of the liquid droplet 30d when step S130 is implemented can be reliably smaller than the reference diameter. In other words, step S130 can be implemented in a state in which the volume of the liquid droplet 30d is reliably less than the reference volume. Thereby, the fill time Ts can be reduced reliably.

Figure 9:
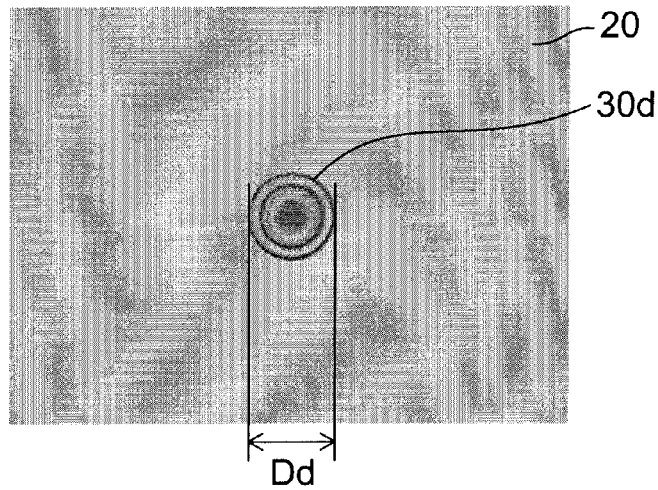
FIG. 9 is a photograph illustrating a liquid droplet of the one other imprint method according to the first embodiment.

FIG. 9 is a photograph illustrating a liquid droplet of the one other imprint method according to the first embodiment.

In other words, this drawing is a photograph of the liquid droplet 30d taken from above the liquid droplet 30d (from a direction along the Z-axis direction) by the imaging unit 171 of the measurement unit 170.

As illustrated in FIG. 9, the liquid droplet 30d having a substantially circular configuration is formed on the processing substrate 20. Interference fringes based on the thickness of the liquid droplet 30d are visible in this drawing. A diameter Dd of the liquid droplet 30d correlates to the liquid droplet volume Vd of the liquid droplet 30d. The contact angle of the transfer material 30 on the major surface 20a of the processing substrate 20 changes due to the relationship between the surface energy of the transfer material 30 and the surface energy of the major surface 20a of the processing substrate 20. Therefore, the relationship between the liquid droplet volume Vd of the liquid droplet 30d of the transfer material 30 and the diameter Dd of the liquid droplet 30d for the combination of, for example, the transfer material 30 and the processing substrate 20 is determined beforehand. The relationship can be derived by experiment or derived by a theoretical calculation. Thus, a reference diameter corresponding to the reference volume can be set using the relationship ascertained for the liquid droplet volume Vd and the diameter Dd of the liquid droplet 30d.

Using this reference diameter, step S181 recited above can be implemented and step S130 can be implemented.

Second Example

An imprint method of a second example of the first embodiment will now be described. The method illustrated in FIG. 8 is performed in the imprint method of the second example.

Figure 10:
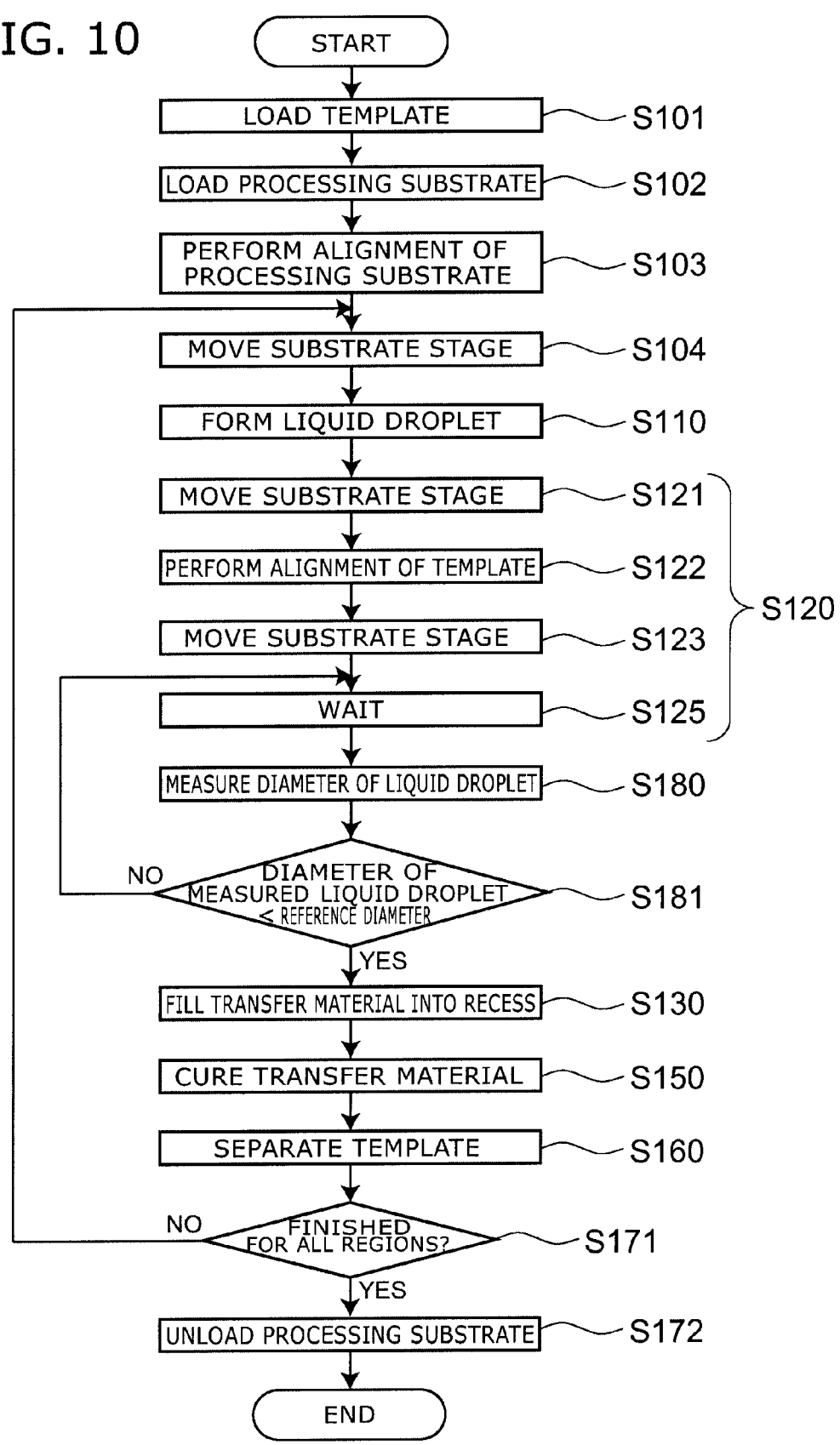
FIG. 10 is a flowchart illustrating an imprint method of a second example.

FIG. 10 is a flowchart illustrating the imprint method of the second example.

The portions of the second example differing from those of the first example will now be described.

As illustrated in FIG. 10, the diameter Dd of the liquid droplet 30d is measured (step S180) after implementing step S120.

The diameter Dd of the measured liquid droplet 30d is compared to the reference diameter (step S181); and step S130 is implemented in the case where the diameter Dd of the measured liquid droplet 30d is smaller than the reference diameter.

In the case where the diameter Dd of the measured liquid droplet 30d is not less than the reference diameter, the flow returns to step S125. Then, for example, a constant amount of time elapses; the volume of the liquid droplet 30d is reduced; the diameter Dd of the liquid droplet 30d is reduced; the flow returns step S180; and the diameter Dd of the liquid droplet 30d is remeasured. The processes recited above may be repeated.

Thereby, step S130 can be implemented in a state in which the diameter Dd of the liquid droplet 30d when step S130 is implemented is reliably smaller than the reference diameter, that is, in which the volume of the liquid droplet 30d is reliably less than the reference volume. Thereby, the fill time Ts can be reduced reliably.

Step S125 recited above may be provided as necessary and may be omitted. For example, the liquid droplet 30d of the major surface 20a of the processing substrate 20 may be continuously imaged by the imaging unit 171; the diameter Dd of the liquid droplet 30d may be continuously measured; and step S180 may be implemented using the measurement results thereof.

In such cases as well, the other processing (step S140i) described in regard to FIG. 6 may be implemented between step S120 and step S130.

Second Embodiment

The second embodiment is the imprint apparatus 210. An example of the configuration of the imprint apparatus 210 is as described above in regard to FIG. 2.

In other words, the imprint apparatus 210 according to this embodiment includes: the substrate stage 120 configured to have the processing substrate 20 placed thereon; the template holder 110 configured to hold the template 10 including the recess 12b provided in the transfer surface 10a; the dropping unit 130 configured to form the liquid droplet 30d of the transfer material 30 with a volume greater than a predetermined reference volume by dropping the transfer material 30 onto the major surface 20a of the processing substrate 20 placed on the substrate stage 120; the distance control unit 140 configured to fill the transfer material 30 into the recess 12b of the template 10 by bringing the liquid droplet 30d and the transfer surface 10a into contact by changing the distance from the major surface 20a of the processing substrate 20 to the transfer surface 10a of the template 10 held by the template holder 110; and the control unit 150 configured to control the distance control unit 140.

The control unit 150 causes the distance control unit 140 to bring the liquid droplet 30d having the volume reduced to be less than the reference volume into contact with the transfer surface 10a after the liquid droplet 30d is volatilized to reduce the volume of the liquid droplet 30d to be less than the reference volume after the dropping unit 130 forms the liquid droplet 30d.

According to the imprint apparatus 210, the liquid droplet 30d having a stable volume can be formed because the liquid droplet 30d is formed with a volume greater than the reference volume (e.g., the first reference volume); and the fill time Ts can be shorter because the transferring is implemented with the liquid droplet 30d having a volume smaller than a reference volume (e.g., the second reference volume not more than the first reference volume). In other words, an imprint apparatus can be provided in which the fill time Ts of the transfer material 30 into the recess 12b of the template 10 is shorter and the productivity is higher.

Then, as described above, the control unit 150 causes the distance control unit 140 to bring the liquid droplet 30d having the reduced volume into contact with the transfer surface 10a after the set wait time has elapsed after the dropping unit 130 forms the liquid droplet 30d, where the set wait time is preset based on data relating to the time dependency of the reduction of the volume of the liquid droplet 30d due to the volatilizing.

The imprint apparatus 210 may further include the measurement unit 170 configured to measure the diameter Dd of the liquid droplet 30d on the major surface 20a of the processing substrate 20. Also, the control unit 150 may cause the distance control unit 140 to bring the liquid droplet 30d having the reduced diameter Dd into contact with the transfer surface 10a when the diameter Dd of the liquid droplet 30d measured by the measurement unit 170 is smaller than the reference diameter determined based on the reference volume.

Thereby, the diameter Dd of the liquid droplet 30d can be reliably smaller than the reference diameter when step S130 that brings the liquid droplet 30d into contact with the transfer surface 10a is implemented. In other words, step S130 can be implemented in a state in which the volume of the liquid droplet 30d is reliably smaller than the reference volume. Thereby, the fill time Ts can be reduced reliably.

By using the imprint method and the imprint apparatus according to the embodiments, besides reducing the fill time Ts, another effect is provided in which the thickness of the residual film is controlled with high precision; and an effect also is provided in which the pattern precision of the transfer material 30 (the cured transfer layer 31) is increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components such as templates, processing substrates, transfer materials, etc., usable in imprint methods and substrate stages, template holders, dropping units, distance control units, control units, measurement units, light irradiation units, etc., included in imprint apparatuses from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all imprint methods and imprint apparatuses practicable by an appropriate design modification by one skilled in the art based on the imprint methods and the imprint apparatuses described above as embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the embodiments described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is clamed is:

1. An imprint method, comprising:
   forming a liquid droplet of a transfer material with a volume greater than a predetermined reference volume by dropping the transfer material onto a major surface of a processing substrate;
   reducing the volume of the liquid droplet to be less than the reference volume by volatilizing the liquid droplet; and
   filling the transfer material into a recess provided in a transfer surface of a template by bringing the liquid droplet having the volume reduced to be less than the reference volume into contact with the transfer surface of the template.

2. The method according to claim 1, further comprising measuring a diameter of the liquid droplet,
   the filling being implemented when the diameter of the liquid droplet measured in the measuring is smaller than a reference diameter determined based on the reference volume.

3. The method according to claim 2, wherein the measuring of the diameter of the liquid droplet includes imaging the liquid droplet using an imaging unit configured to perform a positional alignment between the processing substrate and the template.

4. The method according to claim 1, wherein the filling is implemented after a set wait time has elapsed from the forming of the liquid droplet, the set wait time being preset based on data relating to a time dependency of the reduction of the volume of the liquid droplet due to the volatilizing.

5. The method according to claim 1, wherein the reference volume is determined based on a volume of the liquid droplet when the volume of the liquid droplet stabilizes in the forming of the liquid droplet.

6. The method according to claim 1, wherein a fluctuation of the volume of the liquid droplet when the liquid droplet is formed with a volume greater than the reference volume is less than a fluctuation of the volume of the liquid droplet when the liquid droplet is formed with a volume less than the reference volume.

7. The method according to claim 1, wherein
   the forming of the liquid droplet includes forming the liquid droplet of the transfer material with a volume greater than a predetermined first reference volume, and
   the filling of the transfer material into the recess by bringing the liquid droplet into contact with the transfer surface includes bringing the liquid droplet having a volume less than a second reference volume less than the first reference volume into contact with the transfer surface.

8. The method according to claim 1, wherein
   the major surface of the processing substrate has a plurality of regions, and
   the forming of the liquid droplet is implemented for one other of the plurality of regions while the reducing of the volume of the liquid droplet is implemented for one of the plurality of regions.

9. The method according to claim 1, wherein
   the major surface of the processing substrate has a plurality of regions, and
   the filling of the transfer material is implemented for one other of the plurality of regions while the reducing of the volume of the liquid droplet is implemented for one of the plurality of regions.

10. The method according to claim 1, wherein
    the major surface of the processing substrate has a plurality of regions, and
    the reducing of the volume of the liquid droplet is implemented for one other of the plurality of regions while the reducing of the volume of the liquid droplet is implemented for one of the plurality of regions.

11. An imprint apparatus, comprising:
    a substrate stage configured to have a processing substrate placed on the substrate stage;
    a template holder configured to hold a template including a recess provided in a transfer surface;
    a dropping unit configured to form a liquid droplet of a transfer material with a volume greater than a predetermined reference volume by dropping the transfer material onto a major surface of the processing substrate placed on the substrate stage;
    a distance control unit configured to fill the transfer material into the recess of the template by bringing the liquid droplet into contact with the transfer surface of the template held by the template holder by changing a distance from the major surface of the processing substrate to the transfer surface; and
    a control unit configured to control the distance control unit,
    the control unit causing the distance control unit to bring the liquid droplet having the volume reduced to be less than the reference volume into contact with the transfer surface after the volume of the liquid droplet is reduced to be less than the reference volume by volatilizing the liquid droplet after the dropping unit forms the liquid droplet.

12. The apparatus according to claim 11, further comprising a measurement unit configured to measure a diameter of the liquid droplet on the major surface,
    the control unit causing the distance control unit to bring the liquid droplet having the reduced diameter into contact with the transfer surface when the diameter of the liquid droplet measured by the measurement unit is smaller than a reference diameter determined based on the reference volume.

13. The apparatus according to claim 12, wherein the measurement unit is capable of imaging the processing substrate and the template to perform a positional alignment between the processing substrate and the template.

14. The apparatus according to claim 11, wherein the control unit causes the distance control unit to bring the liquid droplet having the reduced volume into contact with the transfer surface after a set wait time has elapsed after the dropping unit forms the liquid droplet, the set wait time being preset based on data relating to a time dependency of the reduction of the volume of the liquid droplet due to the volatilizing.

15. The apparatus according to claim 11, wherein a fluctuation of the volume of the liquid droplet when the liquid droplet is formed by the dropping unit with a volume greater than the reference volume is less than a fluctuation of the volume of the liquid droplet when the liquid droplet is formed by the dropping unit with a volume less than the reference volume.

16. The apparatus according to claim 11, further comprising a light irradiation unit configured to irradiate light onto the transfer material filled into the recess of the template.

17. The apparatus according to claim 11, wherein the dropping unit dispenses the transfer material using an inkjet method.

18. The apparatus according to claim 11, wherein
the forming of the liquid droplet by the dropping unit includes forming the liquid droplet of the transfer material with a volume greater than a predetermined first reference volume, and
the filling of the transfer material into the recess by the distance control unit bringing the liquid droplet into contact with the transfer surface includes bringing the liquid droplet having a volume less than a second reference volume less than the first reference volume into contact with the transfer surface.

19. The apparatus according to claim 11, wherein
the major surface of the processing substrate has a plurality of regions, and
the dropping unit forms the liquid droplet for one other of the plurality of regions between when the dropping unit forms the liquid droplet for one of the plurality of regions and when the distance control unit fills the transfer material for the one of the plurality of regions.

20. The apparatus according to claim 11, wherein
the major surface of the processing substrate has a plurality of regions, and
the distance control unit fills the transfer material for one other of the plurality of regions between when the dropping unit forms the liquid droplet for one of the plurality of regions and when the distance control unit fills the transfer material for the one of the plurality of regions.

* * * * *